United States Patent
Butler et al.

(10) Patent No.: US 11,169,450 B2
(45) Date of Patent: Nov. 9, 2021

(54) PNEUMATIC SUPPORT DEVICE AND LITHOGRAPHIC APPARATUS WITH PNEUMATIC SUPPORT DEVICE

(71) Applicant: ASML Netherlands B.V., Veldhoven (NL)

(72) Inventors: Hans Butler, Best (NL); Joep Sander De Beer, Oss (NL); Cornelius Adrianus Lambertus De Hoon, Eindhoven (NL); Jeroen Pieter Starreveld, Knegsel (NL); Martinus Van Duijnhoven, Deurne (NL); Maurice Willem Jozef Etiënne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/050,264

(22) PCT Filed: Mar. 18, 2019

(86) PCT No.: PCT/EP2019/056650
§ 371 (c)(1),
(2) Date: Oct. 23, 2020

(87) PCT Pub. No.: WO2019/206517
PCT Pub. Date: Oct. 31, 2019

(65) Prior Publication Data
US 2021/0080834 A1    Mar. 18, 2021

(30) Foreign Application Priority Data

Apr. 25, 2018    (EP) .................................... 18169148

(51) Int. Cl.
*G03F 7/20*    (2006.01)

(52) U.S. Cl.
CPC .................................. *G03F 7/709* (2013.01)

(58) Field of Classification Search
CPC ...... B60N 2/501; B60N 2/525; A01M 7/0057; F16F 15/027; F16F 15/02; F16F 15/0275;
(Continued)

(56) References Cited

U.S. PATENT DOCUMENTS

| 6,020,964 A | 2/2000 | Loopstra et al. |
| 6,170,622 B1 | 1/2001 | Wakui et al. |

(Continued)

FOREIGN PATENT DOCUMENTS

| EP | 1 124 078 A2 | 8/2001 |
| EP | 2 045 686 A2 | 4/2009 |

(Continued)

OTHER PUBLICATIONS

International Search Report and Written Opinion of the International Searching Authority directed to related International Patent Application No. PCT/EP2019/056650, dated Jun. 13, 2019; 11 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

The invention provides a pneumatic support device for a lithographic apparatus and a lithographic apparatus with such support device. The support device comprises a gas spring. The gas spring comprises a suspending part, a suspended part, and a pressure chamber configured for supporting the suspended part relative to the suspending part. The support device further comprises an actuator configured for positioning the suspended part relative to the suspending part, an acceleration sensor configured for generating a first sensor signal representative for the accelera- (Continued)

tion of the suspending part, a pressure sensor configured for generating a second sensor signal representative for the pressure in the pressure chamber, and a control unit. The control unit is configured to: receive the first sensor signal, receive the second sensor signal, filter the first sensor signal in a low-pass filter, filter the second sensor signal in a high-pass filter, determine, based on the filtered first sensor signal and filtered second sensor signal, a force exerted by the suspending part on the suspended part, and generate, based on said force, a control signal for the actuator.

20 Claims, 6 Drawing Sheets

(58) Field of Classification Search
CPC .............. G03F 7/70725; G03F 7/70816; G03F 7/70833; G03F 7/709; G03F 7/70758; G03F 7/70775; G03F 7/70766; G03F 7/70716; G03F 7/70341; B60G 17/017; B60G 17/0185; B60G 17/016; B60G 17/0165; B60G 17/018; B60G 17/019; B60G 17/0162; B60G 9/003; F16C 32/06; B62D 7/159; E02F 9/2267
See application file for complete search history.

(56) References Cited

U.S. PATENT DOCUMENTS

| | | | |
|---|---|---|---|
| 6,952,253 | B2 | 10/2005 | Lof et al. |
| 2001/0040324 | A1 | 11/2001 | Mayama et al. |
| 2005/0140961 | A1 | 6/2005 | Yanagisawa et al. |
| 2007/0058173 | A1 | 3/2007 | Holzapfel |
| 2008/0309910 | A1 | 12/2008 | Takahashi |
| 2009/0153832 | A1* | 6/2009 | Tatsuzaki ............... G03F 7/709 355/72 |
| 2009/0180092 | A1* | 7/2009 | Butler ................... F16F 15/002 355/67 |
| 2017/0370442 | A1 | 12/2017 | Evers et al. |

FOREIGN PATENT DOCUMENTS

| | | |
|---|---|---|
| JP | 2001-332477 A | 11/2001 |
| WO | WO 2015/159513 A1 | 10/2015 |

OTHER PUBLICATIONS

International Preliminary Report on Patentability directed to related International Patent Application No. PCT/EP2019/056650, dated Oct. 27, 2020; 8 pages.

* cited by examiner

PNEUMATIC SUPPORT DEVICE AND LITHOGRAPHIC APPARATUS WITH PNEUMATIC SUPPORT DEVICE

CROSS-REFERENCE TO RELATED APPLICATIONS

This application claims priority of EP application 18169148.6 which was filed on Apr. 25, 2018 and which is incorporated herein in its entirety by reference.

FIELD

The present invention relates to a pneumatic support device for a lithographic apparatus and to an assembly comprising such a support device and a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a lithographic apparatus transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. Typically, such a patterned radiation beam undergoes various transformations (e.g. a demagnification) between the patterning device and the target portion on the substrate. Such transformations are typically realized by means of a projection system which may include various optical elements such as mirrors and/or lenses. In case, during the transfer of the pattern to the target portion, a relative position of such optical elements would change, this could cause a deformation or a displacement of the patterned radiation beam as received by the substrate.

Such a deformation or displacement may cause an overlay error. In order to avoid or mitigate this effect, it has been suggested to support the frame carrying the projection system on the base frame by means of one or more pneumatic support devices and to use the acceleration experienced by the base frame in a feedforward control in order to prevent forces acting on the base frame from disturbing the position of the projection system. It has however been observed that this feedforward control does satisfy the increasing demands on accuracy of position compensation of vital components of the lithographic apparatus, like the illumination system, the projection system, the substrate support, and the mask support. As such there is a need for a pneumatic support device with an improved isolation from accelerations of the base frame, more in general there is a need for a pneumatic support device in which a suspended part of the pneumatic support device is better isolated from accelerations of a suspending part of the pneumatic support device.

SUMMARY

It is desirable to provide a lithographic apparatus whereby a position of optical elements of a projection system may be controlled more accurately.

According to a first aspect of the invention there is provided a pneumatic support device for a lithographic apparatus,
wherein the pneumatic support device comprises:
  a gas spring, comprising:
    a suspending part,
    a suspended part, and
    a pressure chamber configured for supporting the suspended part relative to the suspending part,
  an actuator configured for positioning the suspended part relative to the suspending part,
  an acceleration sensor configured for generating a first sensor signal representative for the acceleration of the suspending part;
  a pressure sensor configured for generating a second sensor signal representative for the pressure in the pressure chamber, and
  a control unit configured to:
    receive the first sensor signal,
    receive the second sensor signal,
    filter the first sensor signal in a low-pass filter,
    filter the second sensor signal in a high-pass filter,
    determine, based on the filtered first sensor signal and filtered second sensor signal, a force exerted by the suspending part on the suspended part, and
    generate, based on said force, a control signal for the actuator.

According to a second aspect of the invention there is provided an assembly comprising a lithographic apparatus and at least one said pneumatic support device according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
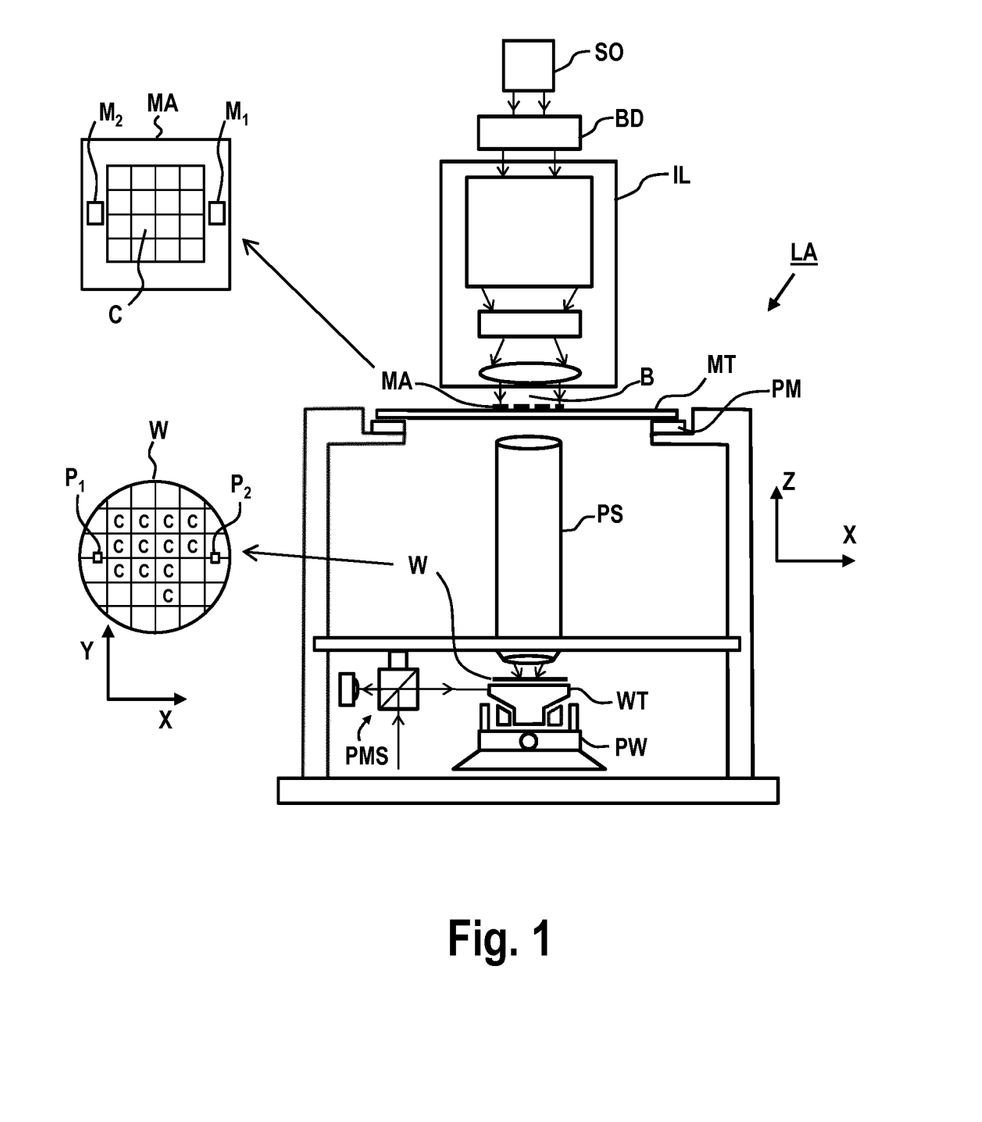
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection systems, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
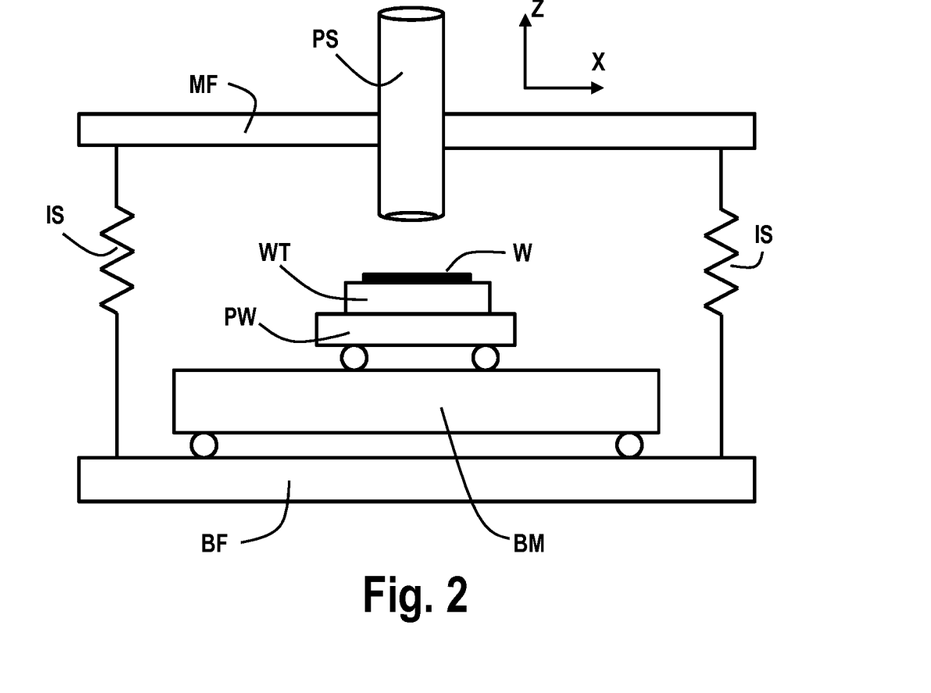
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a second frame MF and a vibration isolation system IS. The second frame MF supports the projection system PS. Additionally, the second frame MF may support a part of the position measurement system PMS. The second frame MF is supported by the base frame BF via the vibration isolation system IS. The vibration isolation system IS is arranged to prevent or reduce vibrations from propagating from the base frame BF to the second frame ME.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BE. For example, wherein the second positioner PW comprises a linear motor and wherein the second positioner PW comprises a bearing, like a gas bearing, to levitate the substrate support WT above the base frame BE.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the second frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the second frame MF or the base frame BE. For example, a plurality of encoder heads are arranged on the second frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the second frame ME. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
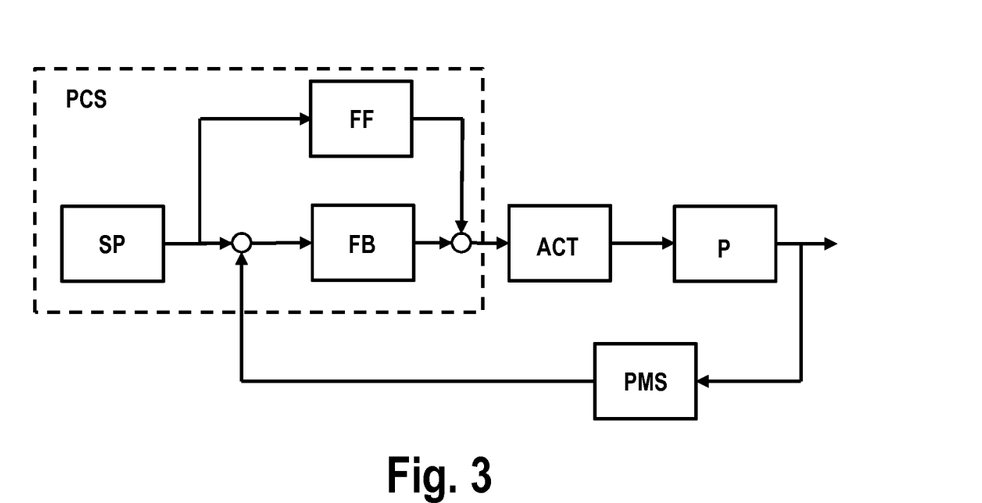
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
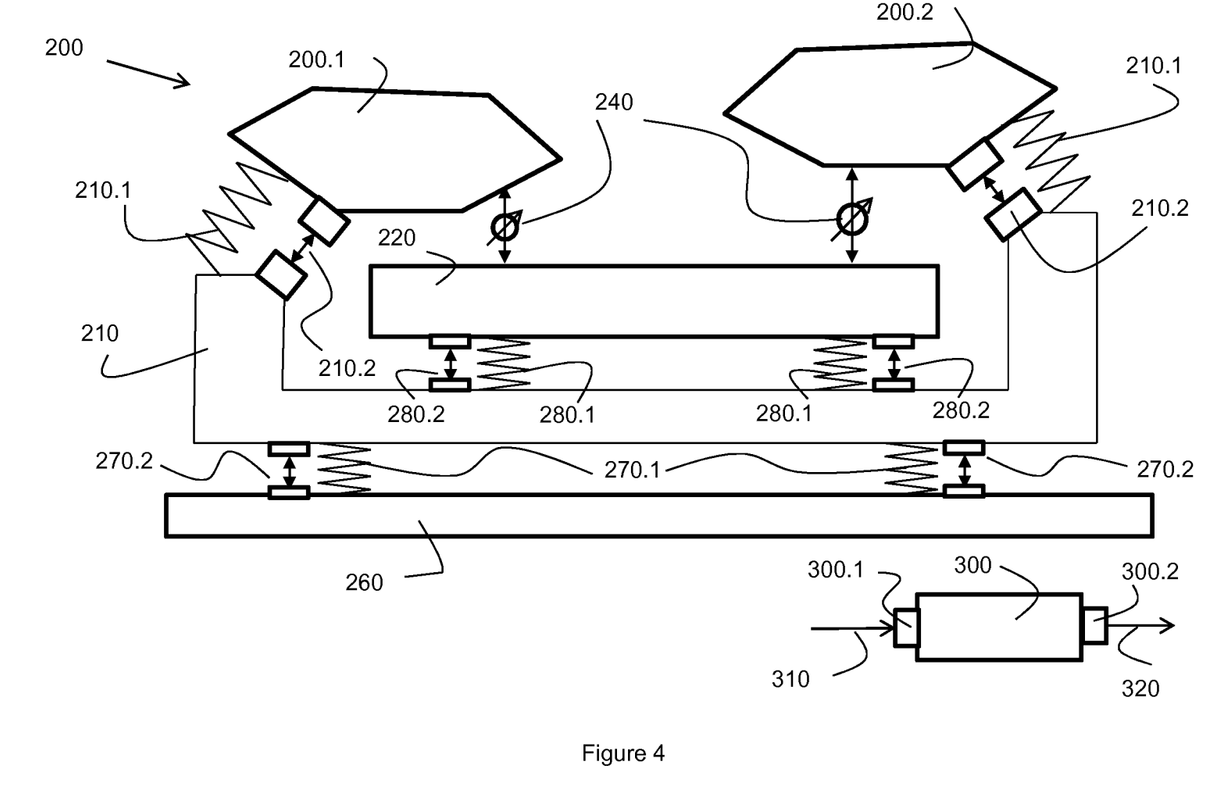
FIG. 4 schematically depicts a first embodiment of a part of a lithographic apparatus according to the invention.

FIG. 4 schematically depicts part of a lithographic apparatus according to an embodiment of the invention. FIG. 4 schematically shows a projection system 200 including two optical elements 200.1 and 200.2. FIG. 4 further shows a force frame 210 configured to support the optical elements 200.1, 200.2. Such a support may e.g. be realized using one or more vibration isolators 210.1 and/or actuators 210.2. In the embodiment as shown, the lithographic apparatus further comprises a position measurement system 240 for measuring a position of the optical elements 200.1, 200.2 relative to the sensor frame 220. In the embodiment as shown, the lithographic apparatus further comprises a sensor frame 220 configured to support a measurement system, e.g. the position measurement system 240. In the embodiment as shown, the force frame 210 is mounted to the base frame 260 of the apparatus, by means of vibration isolators 270.1 and/or actuators 270.2. Further, as can be seen, the sensor frame 220 is mounted, by means of vibration isolators 280.1 and/or actuators 280.2 to the force frame. In the embodiment as schematically shown, the combination of a vibration isolator 270.1 and an actuator 270.2 may correspond to a pneumatic support device according to the invention.

Figure 5:
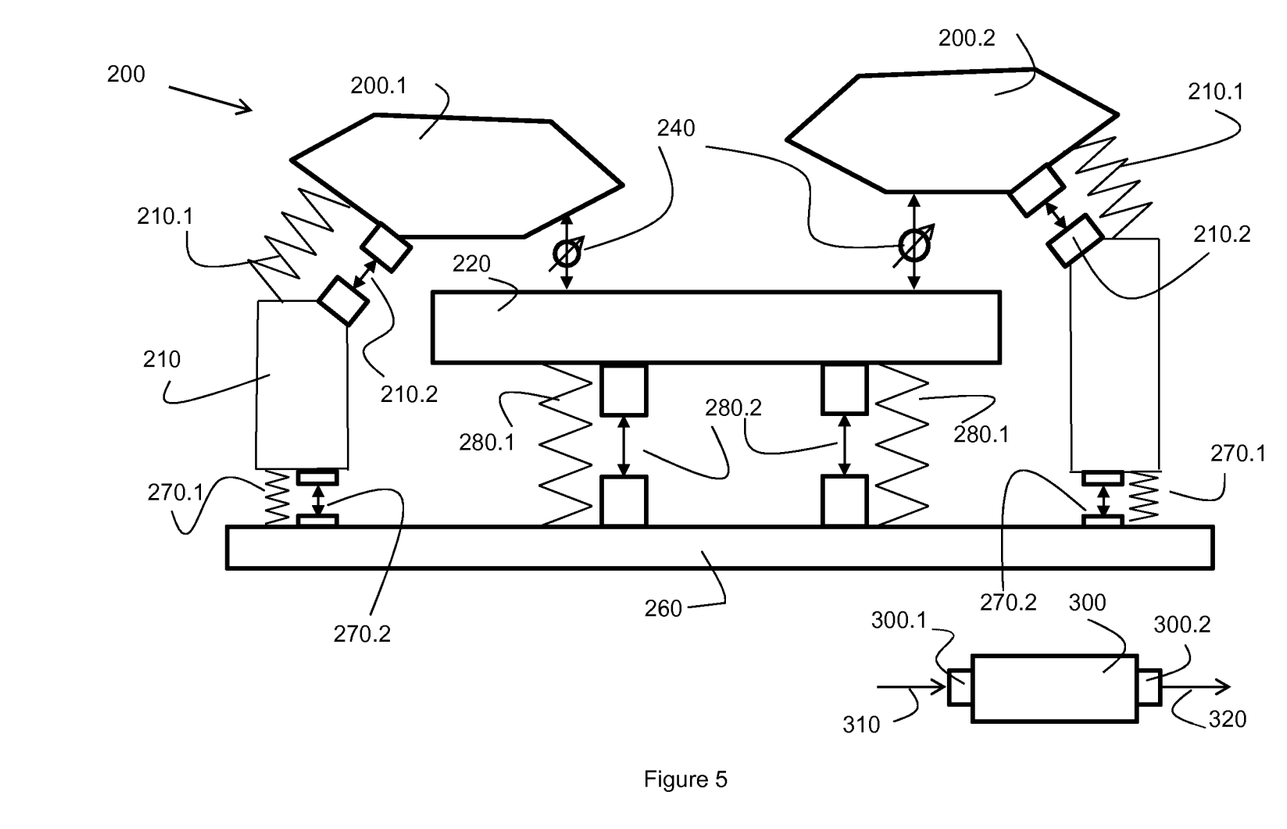
FIG. 5 schematically depicts a second embodiment of a part of a lithographic apparatus according to the invention.

In the embodiment of the invention as shown in FIG. 4, the sensor frame 220 is supported, by means of vibration isolators 280.1, by the force frame 210. It can be pointed out that alternative arrangements may be considered as well. A further embodiment of the invention with such an alternative arrangement is schematically shown in FIG. 5. As shown in FIG. 5, the sensor frame 220 may be mounted to the base frame 260, in a similar manner as the force frame 210 is mounted to the base frame 260. In such embodiment, the combination of a vibration isolator 270.1 and an actuator 270.2 may correspond to a pneumatic support device according to the invention. In addition, or alternatively, in the embodiment as schematically shown, the combination of a vibration isolator 280.1 and an actuator 280.2 may correspond to a pneumatic support device according to the invention.

As such, in an embodiment of the invention, the lithographic apparatus comprises a control unit 300 configured to control an operating parameter or state of the apparatus. Such a control unit 300 may e.g. be embodied as a controller, microprocessor, computer or the like.

In the embodiment as shown in FIG. 4, the control unit 300 may comprise an input terminal 300.1 for receiving input signals 310. In the embodiment of FIG. 4, the input terminal 300.1 may be configured to receive measurement signals representative for the state of the base frame, whereby the control unit 300 may be configured to determine, based on the measurement signals as received, an acceleration of the force frame 210 (or force exerted on the force frame by the base frame). Based on this acceleration/force information, the control unit may e.g. generate a control signal and output this control signal 320 via an output terminal 300.2 of the control unit 300. Such a control signal 320 may e.g. be a control signal for controlling an the operation of the actuators 270.2, thereby controlling a position of the force frame 210.

In the embodiment as shown in FIG. 5, the control unit 300 may comprise an input terminal 300.1 for receiving input signals 310. In the embodiment of FIG. 5, the input terminal 300.1 may—similar to the embodiment of FIG. 4—be configured to receive measurement signals representative for the state of the base frame, whereby the control unit 300 may be configured to determine, based on the measurement signals as received, an acceleration of the force frame 210 (or force exerted on the force frame by the base frame). Based on this acceleration/force information, the control unit may e.g. generate a control signal and output this control signal 320 via an output terminal 300.2 of the control unit 300. Such a control signal 320 may e.g. be a control signal for controlling an the operation of the actuators 270.2, thereby controlling a position of the force frame 210. Alternatively or in addition, the control unit 300 may, in the embodiment of FIG. 5, be configured to determine, based on the measurement signals as received, an acceleration of the sensor frame 220 (or force exerted on the sensor frame by the base frame). Based on this acceleration/force information, the control unit may e.g. generate a control signal and output this control signal 320 via an output terminal 300.2 of the control unit 300. Such a control signal 320 may e.g. be a control signal for controlling an the operation of the actuators 280.2, thereby controlling a position of the sensor frame 210.

Further as shown, a displacement of the optical elements 200.1 and/or 200.2 relative to the sensor frame 220 can be monitored, by means of the position measurement system 240. Such a position measurement system may e.g. comprise an interferometer based measurement system or an encoder based measurement system. Capacitive or inductive measurement system may be considered as well.

Alternatively, or in addition, the control unit 300 as applied in the embodiment of the present invention may be configured to receive the position measurement signals of the position measurement systems 240, whereby the control unit 300 may be configured to determine, based on the measurement signals as received, a position of the optical elements 200.1, 200.2 of the projection system 200. Based on this positional information, the control unit may e.g. generate a control signal and output this control signal 320 via an output terminal 300.2 of the control unit 300. Such a control signal 320 may e.g. be a control signal for controlling an operation of the actuators 210.2, thereby controlling a position of the optical elements 200.1, 200.2.

As a further alternative, or addition, the control unit 300 as applied in the embodiment of the present invention may be configured to determine a control signal for controlling a positioning of a substrate in the lithographic apparatus, in particular a positioning of the substrate relative to a patterned radiation beam that is projected onto the substrate via the projection system 200. By doing so, a displacement of the patterned radiation beam due to a displacement of the one or more of the optical elements of the projection system 200 may be corrected for.

In accordance with the present invention, the second frame, e.g. the force frame, is supported on the base frame by one or more gas springs 270.1, such as air mounts.

Figure 6:
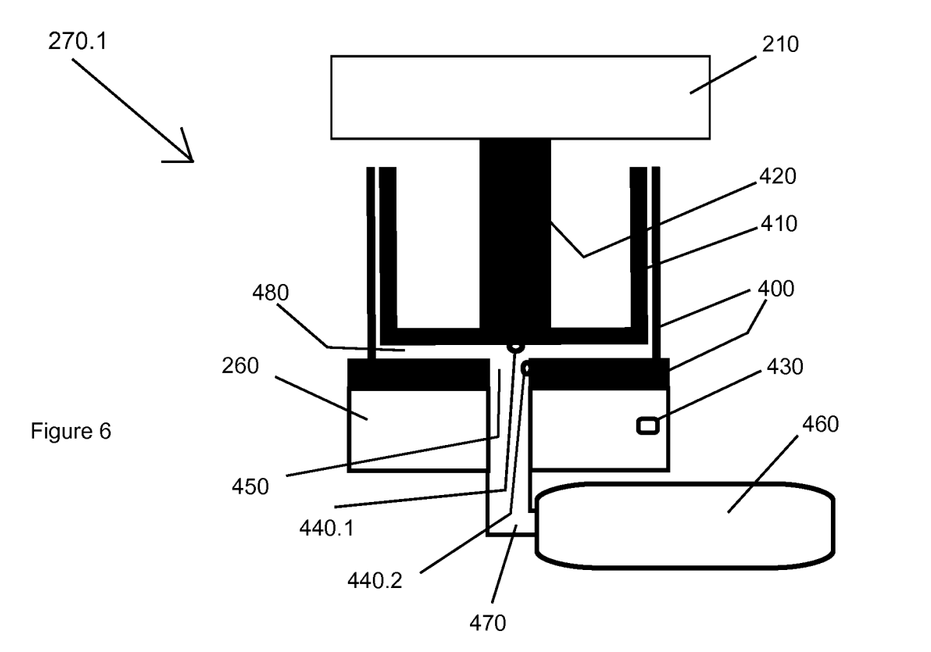
FIG. 6 schematically depicts a pneumatic support device according to the invention.

An example of a gas spring 270.1 is schematically shown in FIG. 6. This gas spring has a suspending part 400, a suspended part 410, 420, and a pressure chamber 480 configured for supporting the suspended part 410, 420 relative to the suspending part 400 parallel to a support direction. In the example of the FIGS. 4 and 5 the second frame/force frame is supported vertically above the base frame, defining in this examples a vertical support direction.

As shown in the example of FIG. 6, the suspending part of the gas spring 270.1 may comprise a cylinder 400 and the suspended part of the gas spring may comprise a piston 410. The cylinder 400 is mounted to the base frame 260 and the piston 410 is mounted to the second frame/force frame 210, for example by means of a piston rod. It is to be noted that it is also possible to mount the piston 410 to the base frame 260 and the cylinder to the second frame/force frame 210. The piston 410 is movable with respect to the cylinder in length direction of the piston/cylinder, which length direction is in FIG. 6 vertically. The pressure chamber is delimited by the cylinder and piston. It is to be noted that, viewed transverse to the length direction, the cross-section of the cylinder and piston might have any mutually mating shape, like a square, oval or circular shape.

As shown in the example of FIG. 6, the cylinder has an opening 450 in its bottom. It is however to be noted that, provided that the opening 450 opens into the pressure chamber 480, this opening might also be provided in the side wall of the cylinder or in the piston.

The pressurized gas for the pneumatic support device may be provided by a pressure source for delivering pressurized gas. This pressure source might comprise any device capable of delivering pressurized gas, like a pump and/or a tank. In the example of FIG. 6, the pressure source is depicted as a tank 460. The pressure source 460 is connected by means of a conduit 470 to the opening 450.

The example of FIG. 6 further shows an acceleration sensor 430 configured for generating a first sensor signal 510 (see FIG. 7) representative for the acceleration of the suspending part 400. This sensor 430 might be provided on the base frame as is shown, on the suspending part 400 or elsewhere, provided that, it is capable to measure directly or indirectly the acceleration of the suspending part. With indirectly measuring the acceleration, is meant that the sensor measures a parameter, like the position or speed, of the suspending part from which the acceleration can be determined. With directly measuring the acceleration is meant that the sensor measures a parameter directly representing the acceleration.

The example of FIG. 6 further shows a pressure sensor 440 configured for generating a second sensor signal 550 (see FIG. 7) representative for the pressure in the pressure chamber 480. FIG. 6 shows two pressure sensors. One pressure sensor 440.1 is arranged in the pressure chamber, in this example on the piston 410 but it might also be provided, in the pressure chamber, on the bottom of the cylinder 400 at a side of this bottom facing the pressure chamber. The other pressure sensor 440.2 is arranged in the opening 450. These two pressure sensors 440.1 and 440.2 are shown as examples of locations where the pressure sensor might be located. According to the invention one pressure sensor is sufficient, but multiple pressure sensors on the same location or different locations might be used.

Figure 7:
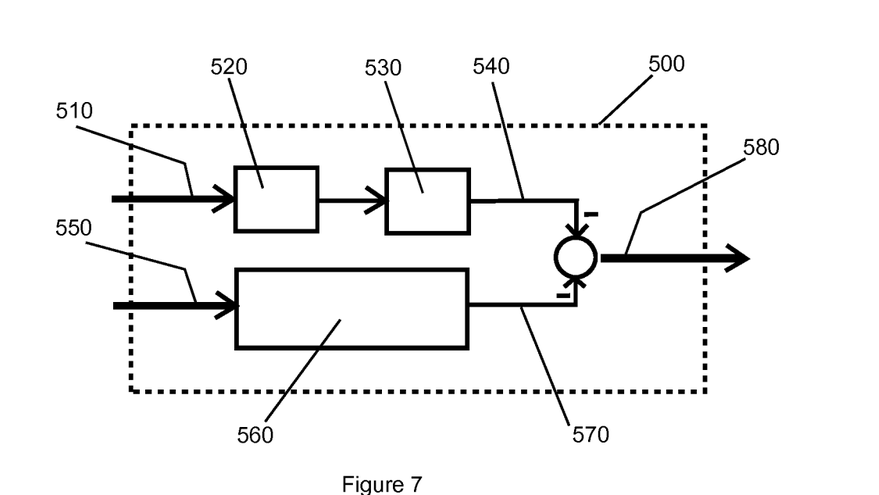
FIG. 7 schematically depicts a control unit of a pneumatic support device according to the invention.

FIG. 7 shows, as an example, control unit 500 or a part of a control unit 500 of a pneumatic support device according to the invention. This (part of the) control unit is a feedforward controller, which may be part of the position control system PCS as schematically depicted in FIG. 3 or part of the control unit 300 as schematically shown in FIGS. 4 and 5.

The (part of the) control unit 500 according to the invention has two parallel branches. The first branch has as its input the first sensor signal 510 representative for the acceleration of the suspending part. This first sensor signal 510, which can be written as $a_{bf}$ (=base frame acceleration), is passed through a transfer filter 520 and through a low-pass filter 530, resulting in a first output 540. In FIG. 7 the transfer filter 520 is shown before the low-pass filter 530, but it is noted that the first sensor signal 510 might also pass through the low-pass filter first and subsequently through the transfer filter 520. The transfer filter 520 might be a tame double integrator, which can be written as $(k_A + d_A s)/(s^2 + 2z_i \omega_i s + \omega_i^2)$, in which s is the Laplace operator. The parameters $k_A$ and $d_A$ represent the stiffness and damping of the pneumatic support device 270 (also called isolator), including the stiffness and damping provided by the limited volume of the air tank 460. The tame double integrator creates a signal representative of base frame position, which by multiplication with stiffness and damping values create a signal representative of the force acting on the supported frame by the isolator. This force is then, with a minus sign, input into the parallel actuator 270.2, essentially compensating the remaining disturbance forces travelling through the isolator 270. The low-pass filter can be written as $H_{lp}$. The second branch has as its input the second sensor signal 550 representative for the pressure in the pressure chamber. This second sensor signal 550, which can be written as $p_p$ (=pressure in pressure chamber), is passed through a high-pass filter 560 having as transfer function $H_{hp} A_{piston}$, wherein $A_{piston}$ is the surface of the piston and $H_{hp} A_{piston}$ is the high-pass filter. The pressure input $p_p$, multiplied by the surface area $A_{piston}$, is indicative for the actual force acting on the piston. This results in a second output 570. Combining the first output 540 with the second output 570 and assuming the transfer filter 520 is a tame double integrator, results in a feedforward force: $F_{ff} = -((k_A + d_A s)/s^2))H_{lp} a_{bf} - A_{piston} H_{hp} p_p$.

According to an embodiment of the invention, the high-pass filter is the inverse of the low-pass filter, i.e. $H_{hp} = (1 - H_{lp})$. In this way, for low frequencies the calculated force based on base frame motion, and for higher frequencies the actual force acting on the piston, is used as feedforward signal.

The transmissibility with only base frame feedforward according to the first branch as described above, is in practise limited to improvements between roughly 0.5 and 10 Hz, due to the spring/damper behaviour of the gas spring. The transmissibility with only base frame feedforward according to the second branch is effective for higher frequencies from 1 to 10 Hz onwards. For lower frequencies, it is limited by the impact of direct disturbance forces on the suspended frame. The second branch has an overlap with the transmissibility of base frame feedforward according to the first branch. Combining these two results in a transmissibility with improved behaviour over a range starting at 0.5 Hz to far over 10 Hz, like up to 50 Hz and more.

Figure 8:
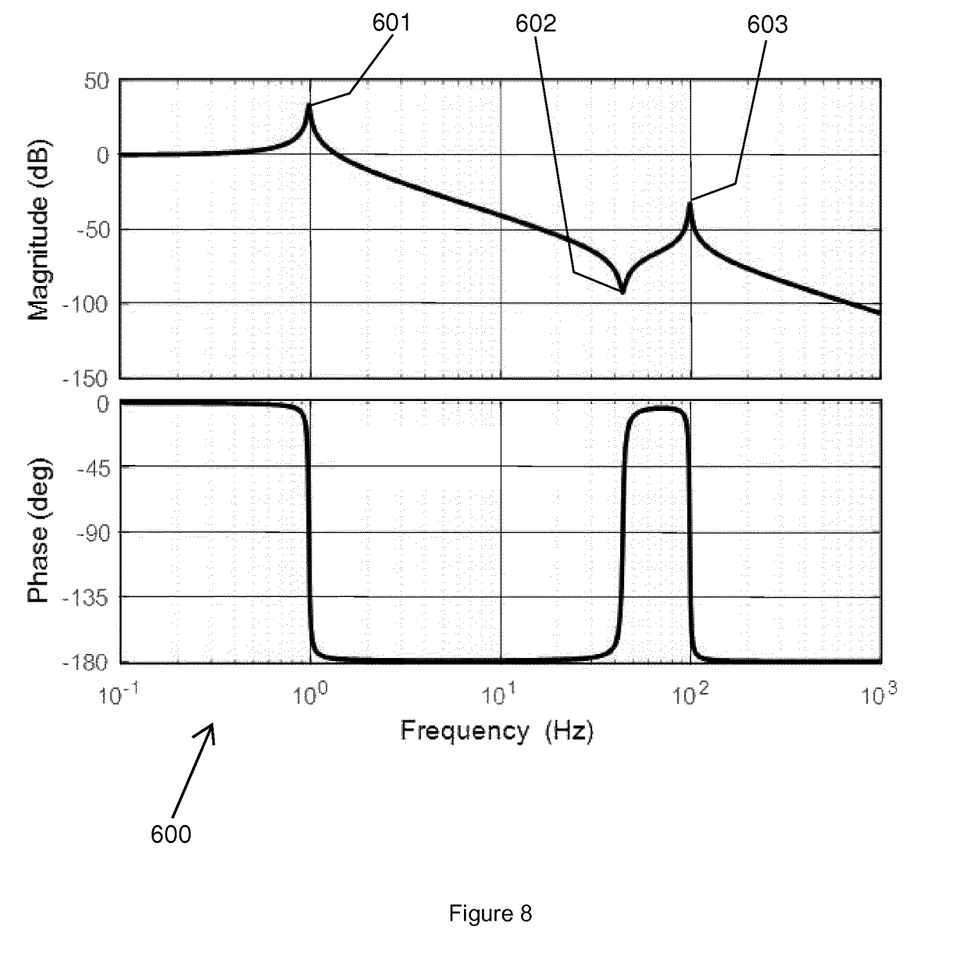
FIG. 8 shows by way of illustration a transfer function of a pneumatic support device according to the present invention.

FIG. 8 shows, by way of example, a transfer function 600 of a pneumatic support device 270 according to the invention in a lithographic apparatus as shown in FIGS. 4 and 5. The upper part of FIG. 8 shows three spikes 601, 602 and 603. The spike 601 is the suspension frequency 601 of the suspended frame 210 (in FIGS. 4, 5 named force frame) with respect to the suspending frame 260 (in FIGS. 4,5 named base frame). This suspension frequency 601 is essentially determined by the stiffness of the pneumatic support device and the mass of the suspended frame. The suspension frequency is also called the undamped natural frequency or eigen frequency. The spike 603 is the first acoustic resonance frequency 603. This first acoustic resonance frequency 603 is mainly determined by the conduit connecting the pressure source, like a tank, to the pressure chamber and the pressure source itself. The spike 602 is the first acoustic anti-resonance frequency 602. This first acoustic anti-resonance frequency 602 is determined by multiple factors, like the ratio of the amount of gas directly below the piston with respect to the amount of gas present in the pressure source.

According to a further embodiment, the cut-off frequency, i.e. the 3 dB cutoff frequency, of both the low-pass filter and the high-pass filter is taken higher than the suspension frequency 601 of the gas spring.

According to another further embodiment, the cut-off frequency, i.e. the 3 dB cutoff frequency, of both the low-pass filter and the high-pass filter is taken lower than the first acoustic resonance frequency 603 of the pneumatic system. According to an embodiment, this cut-off frequency, i.e. the 3 dB cutoff frequency, of both the low-pass filter and the high-pass filter is taken lower than the first acoustic anti-resonance frequency 603 of the pneumatic system.

The first feedforward branch, making us of base frame acceleration, is not accurate in the frequency range where acoustical effects play a role. Looking at FIG. 8, the cut-off frequencies are configured below the resonance frequency 603 in order to prevent these from influencing the accuracy of the feedforward control. In order to also prevent the anti-resonance frequency 602 from influencing the accuracy of the control, the cut-off frequency of the low-pass filter is configured below the anti-resonance frequency 602. The pressure sensor accurately measures these acoustical effects, but for low frequencies the pressure sensor cannot be used. This because a force input to the suspended frame has a relatively large effect, and because the compensating force is acting on the suspended frame as well, there is a control stability risk. In order to avoid this risk, the cut-off frequency of the high-pass filter is configured above the suspension frequency 601.

Referring to the above elucidation of the invention in relation to the pneumatic support device 270 in the FIGS. 4-7, it is noted that the pneumatic support device 280 of FIG. 5 can equally well be a pneumatic support device according to the invention. In the embodiment of FIG. 5 it is also conceivable that the support device 270 is not according to the invention and that the pneumatic support device 280 is according to the invention. In case the pneumatic support device 280 is according to the invention, the suspended frame is the sensor frame 220 (whilst for the pneumatic support device 270 the suspended frame is the force frame 210). In addition it is noted that, additionally or alternatively, the pneumatic support device according to the invention might be used for other supports in a lithographic apparatus as well.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A pneumatic support device for a lithographic apparatus, wherein the pneumatic support device comprises:
   a gas spring, comprising:
      a suspending part;
      a suspended part, at least partially disposed within the suspending part; and
      a pressure chamber configured to support the suspended part relative to the suspending part;
   an actuator configured to position the suspended part relative to the suspending part based on a control signal;
   an acceleration sensor configured to generate a first sensor signal representative of the acceleration of the suspending part;
   a pressure sensor disposed within the pressure chamber and configured to generate a second sensor signal representative of the pressure in the pressure chamber; and
   a control unit configured to:
      receive the first sensor signal from the acceleration sensor;
      receive the second sensor signal from the pressure sensor;
      filter the first sensor signal in a low-pass filter;
      filter the second sensor signal in a high-pass filter;
      determine, based on the filtered first sensor signal and filtered second sensor signal, a force exerted by the suspending part on the suspended part; and
      generate, based on the force, the control signal to control the actuator.

2. The pneumatic support device of claim 1, wherein the high-pass filter is the inverse of the low-pass filter.

3. The pneumatic support device of claim 1, wherein the low-pass filter and high-pass filter each have a cut-off frequency, the cut-off frequency of the low-pass filter being lower than the cut-off frequency of the high-pass filter.

4. The pneumatic support device of claim 3, wherein the low-pass filter and high-pass filter each have a slope, the slope of the low-pass filter being the inverse of the slope of the high-pass filter.

5. The pneumatic support device of claim 1, wherein:
   the low-pass filter and high-pass filter each have a cut-off frequency; and
   these cut-off frequencies are higher than a suspension frequency.

6. The pneumatic support device of claim 1, wherein:
   the low-pass filter and high-pass filter each have a cut-off frequency; and
   these cut-off frequencies are lower than a first acoustic resonance frequency.

7. The pneumatic support device of claim 1, wherein:
   the low-pass filter and high-pass filter each have a cut-off frequency; and
   these cut-off frequencies are lower than a first acoustic anti-resonance frequency.

8. The pneumatic support device of claim 1, wherein the high-pass filter and low-pass filter are configured as electronic filters, analog electronic filters, or digital electronic filters.

9. The pneumatic support device of claim 1, wherein:
   the suspending part of the gas spring comprises a cylinder and the suspended part of the gas spring comprises a piston, the piston being movably arranged in the cylinder, and the cylinder and piston delimiting the pressure chamber;
   the pneumatic support device furthermore comprises:
      an opening configured for supplying pressurized gas into the pressure chamber; and
      a conduit configured to connect the opening to a pressure source for supply of pressurized gas to the pressure chamber; and
   the pressure sensor is arranged in the pressure chamber or the opening and configured to measure the pressure prevailing in the pressure chamber or the opening, respectively.

10. The pneumatic support device of claim 9, wherein the pressure sensor is arranged on a side of the bottom of the cylinder facing the pressure chamber.

11. A lithographic apparatus comprising:
    at least one pneumatic support device for a lithographic apparatus, wherein the pneumatic support device comprises:
       a gas spring, comprising:
          a suspending part;
          a suspended part, at least partially disposed within the suspending part; and
          a pressure chamber configured to support the suspended part relative to the suspending part;
       an actuator configured to position the suspended part relative to the suspending part based on a control signal,
       an acceleration sensor configured to generate a first sensor signal representative of the acceleration of the suspending part;
       a pressure sensor disposed within the pressure chamber and configured to generate a second sensor signal representative of the pressure in the pressure chamber; and
       a control unit configured to:
          receive the first sensor signal from the acceleration sensor;
          receive the second sensor signal from the pressure sensor;
          filter the first sensor signal in a low-pass filter;
          filter the second sensor signal in a high-pass filter;
          determine, based on the filtered first sensor signal and filtered second sensor signal, a force exerted by the suspending part on the suspended part; and
          generate, based on the force, the control signal to control the actuator.

12. The lithographic apparatus of claim 11, further comprising a projection system configured to project a patterned beam of radiation onto a substrate, the projection system comprising a plurality of optical elements.

13. The lithographic apparatus of claim 12, wherein the plurality of optical elements comprises a plurality of mirrors and mirror actuators configured for positioning the mirrors.

14. The lithographic apparatus of claim 11, further comprising:
    a first frame and a second frame supported by the first frame,
    wherein the suspending part of the pneumatic support device is mounted to the first frame and
    wherein the suspended part of the pneumatic support device is mounted to the second frame.

15. The lithographic apparatus of claim 14, wherein:
the first frame is a base frame of the lithographic apparatus; and
the projection system is mounted to the second frame.

16. The lithographic apparatus of claim 12, further comprising:
a sensor frame configured to support a measurement system.

17. The lithographic apparatus of claim 16, wherein:
the measurement system comprises a position measuring system that is configured to measure the position of the plurality of optical elements relative to the sensor frame.

18. The lithographic apparatus of claim 16, further comprising:
a base frame; and
a force frame mounted to the base frame,
wherein the sensor frame is mounted to the force frame.

19. The lithographic apparatus of claim 18, wherein:
the force frame is mounted to the base frame via vibration isolators and/or actuators.

20. The lithographic apparatus of claim 18, wherein:
the sensor frame is mounted to the force frame via vibration isolators and/or actuators.

* * * * *